United States Patent
Backes

(10) Patent No.: US 7,675,369 B2
(45) Date of Patent: Mar. 9, 2010

(54) FREQUENCY HOPPING OSCILLATOR CIRCUIT

(75) Inventor: Glen B. Backes, Maple Grove, MN (US)

(73) Assignee: Honeywell International Inc., Morristown, NJ (US)

( * ) Notice: Subject to any disclaimer, the term of this patent is extended or adjusted under 35 U.S.C. 154(b) by 59 days.

(21) Appl. No.: 11/423,573

(22) Filed: Jun. 12, 2006

(65) Prior Publication Data

US 2007/0296510 A1    Dec. 27, 2007

(51) Int. Cl.
*H03L 7/06* (2006.01)
*H03B 29/00* (2006.01)

(52) U.S. Cl. ............................... 331/18; 331/2; 331/16; 331/78

(58) Field of Classification Search .................... 331/18, 331/2, 16, 78; 375/132
See application file for complete search history.

(56) References Cited

U.S. PATENT DOCUMENTS

| | | | |
|---|---|---|---|
| 3,983,484 A | 9/1976 | Hodama | |
| 4,320,357 A | 3/1982 | Wulfsberg et al. | |
| 4,511,886 A * | 4/1985 | Rodriguez | 340/534 |
| 4,977,613 A | 12/1990 | Holcomb, Sr. et al. | |
| 5,028,887 A | 7/1991 | Gilmore | |
| 5,144,254 A * | 9/1992 | Wilke | 327/107 |
| 5,146,186 A | 9/1992 | Vella | |
| 5,343,168 A | 8/1994 | Guthrie | |
| 5,414,741 A * | 5/1995 | Johnson | 375/376 |
| 5,542,113 A * | 7/1996 | Fink et al. | 455/119 |
| 5,570,066 A * | 10/1996 | Eberhardt et al. | 331/34 |
| 5,642,039 A | 6/1997 | Bradley et al. | |
| 5,742,208 A * | 4/1998 | Blazo | 331/23 |
| 5,757,239 A | 5/1998 | Gilmore | |
| 5,825,253 A | 10/1998 | Mathe et al. | |
| 5,838,749 A | 11/1998 | Casper et al. | |
| 5,977,779 A * | 11/1999 | Bradley | 324/638 |
| 6,078,444 A * | 6/2000 | Vishakhadatta et al. | 360/32 |
| 6,236,275 B1 * | 5/2001 | Dent | 331/1 A |
| 6,396,355 B1 | 5/2002 | Rezin | |
| 6,674,332 B1 * | 1/2004 | Wunner et al. | 331/18 |
| 6,714,085 B1 * | 3/2004 | Fette | 331/17 |
| 6,744,828 B1 | 6/2004 | Uchiyama et al. | |
| 6,819,194 B2 * | 11/2004 | Toncich et al. | 331/158 |
| 7,199,698 B1 * | 4/2007 | Goldfarb | 331/177 V |
| 7,221,921 B2 * | 5/2007 | Maligeorgos et al. | 455/260 |
| 7,228,118 B2 * | 6/2007 | Stevenson | 455/259 |
| 2002/0024393 A1 * | 2/2002 | Kunkel | 331/1 R |
| 2002/0159554 A1 | 10/2002 | Nosaka et al. | |
| 2002/0173284 A1 | 11/2002 | Forrester | |

FOREIGN PATENT DOCUMENTS

EP    0 497 801 B1    7/1995

* cited by examiner

*Primary Examiner*—Robert Pascal
*Assistant Examiner*—Levi Gannon
(74) *Attorney, Agent, or Firm*—Fogg & Powers LLC

(57) ABSTRACT

A method for controlling a frequency output of a phase locked loop (PLL) is provided. The method includes providing digital control words to the PLL to discretely change at least one dividing factor within the PLL. The method further includes applying a time-varying control voltage to a voltage controlled oscillator. The method still further includes applying an output of the voltage controlled oscillator to the PLL as a reference frequency. The method further includes outputting a signal from the PLL, the signal varied in frequency based on one or more of the time-varying control voltage and the at least one dividing factor.

15 Claims, 3 Drawing Sheets

FREQUENCY HOPPING OSCILLATOR CIRCUIT

BACKGROUND OF THE INVENTION

This invention relates generally to electronic circuits and more specifically, to a frequency hopping oscillator circuit that may be utilized in, for example, a phase locked loop (PLL).

It is common to utilize a PLL in conjunction with a voltage controlled oscillator to coherently provide a local oscillator signal to a receiver and transmitter circuit within a transceiver. A PLL typically utilizes a reference oscillator which is used as a reference frequency to "lock" the output local oscillator (LO) at a specific frequency. The reference oscillator is typically of a high quality crystal type which provides a low phase noise reference to the PLL. Various types of crystal oscillators exist, including oven-controlled crystal oscillators (OCXO), temperature-controlled crystal oscillators (TCXO), and voltage controlled crystal oscillators (VCXO). The VCXO reference frequency can be fine-tuned by adjusting a DC control voltage. Using any of the above described reference oscillators is common practice in PLL circuits.

A problem arises when two or more narrow-band coherent transceivers are in close proximity. If the transmit signals from those transceivers are at the same frequency, they may adversely interfere with one another. One current method to reduce the interference is for each transceiver to randomly change frequency within a bandwidth. Each of these frequency changes is commonly referred to as a frequency hop, and multiple frequency changes are referred to as frequency hopping. A digital circuit provides digital data to the PLL in order to initiate such a frequency hop. Increasing the number of frequency hops within a fixed bandwidth improves the interference rejection, however, when using currently available phase locked loop oscillator circuitry for the local oscillator, increasing the number of frequency hops degrades the phase noise of the oscillator such that an upper limit of discrete frequencies within the bandwidth cannot be exceeded, therefore limiting the amount of interference that can be rejected.

With known frequency hopping oscillator circuits, there are limitations on the number of discrete frequency hops that can be created within a fixed bandwidth without degrading the phase noise.

BRIEF DESCRIPTION OF THE INVENTION

In one aspect, a method for controlling a frequency output of a phase locked loop (PLL). The method includes providing digital control words to the PLL to discretely change at least one dividing factor within the PLL. The method further includes applying a time-varying control voltage to a voltage controlled oscillator. The method still further includes applying an output of the voltage controlled oscillator to the PLL as a reference frequency. The method further includes outputting a signal from the PLL, the signal varied in frequency based on one or more of the time-varying control voltage and the at least one dividing factor.

In another aspect, a unit for providing a reference frequency to a phase locked loop (PLL). The unit includes a voltage controlled oscillator and a signal generator, wherein the signal generator is configured to supply a randomly varying control voltage to the voltage controlled oscillator which causes the voltage controlled oscillator to output a varying reference frequency.

In yet another aspect, a system for providing local oscillator frequencies for at least one of a transmitter, receiver, and transceiver. The system includes a phase locked loop (PLL), a voltage controlled oscillator, and a signal generator. The signal generator is configured to supply a randomly varying control voltage to the voltage controlled oscillator. The voltage controlled oscillator is configured to provide a reference frequency to the PLL based on the randomly varying control voltage. The local oscillator frequencies are based on an output of the PLL.

DETAILED DESCRIPTION OF THE INVENTION

The present invention provides a method and system for increasing the number of frequency hops and increasing the frequency agility of a local oscillator output of a phase locked loop (PLL) without degrading phase noise of the oscillator. A PLL generates a frequency output based on a reference frequency. Since the PLL contains a feedback loop, the generated frequency signal is as stable as the reference frequency.

Figure 1:
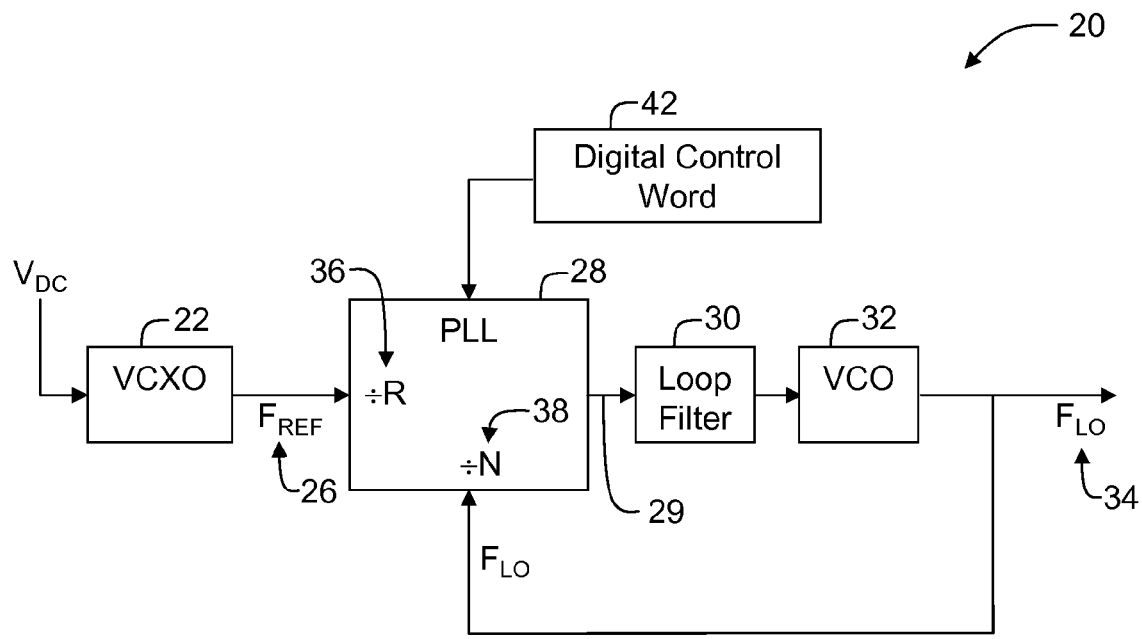
FIG. 1 is a block diagram of a phase locked loop (PLL) circuit.

Referring now to the drawings, FIG. 1 shows a block diagram of a PLL circuit 20. PLL circuit 20 includes a crystal oscillator 22, in this example a voltage controlled crystal oscillator (VCXO), which receives a DC voltage source input. Crystal oscillator 22 outputs a reference frequency ($F_{REF}$) 26 that is provided to a PLL 28. PLL 28 is known in the art, and it is also known that the functions of PLL 28 can be achieved utilizing discrete components or with one or more known integrated circuits. Reference frequency 26 can be fine-tuned by varying the DC control voltage applied to VCXO 22. An output 29 of PLL 28 is input into a loop filter 30 and an output of loop filter 30 is input into a voltage controlled oscillator (VCO) 32. VCO 32 is also sometimes referred to as a local oscillator (LO) and further provides a stable output frequency ($F_{LO}$) 34. $F_{LO}$ 34 is also fed back to PLL 28. PLL circuit 20 typically includes divider circuitry 36 that divides $F_{REF}$ 26 by a factor, R. PLL circuit 20 also typically includes divider circuitry 38 that divides the portion of $F_{LO}$ 34 fed back to PLL 28 by a factor, N. The two divide by factors, N and R, are chosen such that $F_{LO}/N = F_{REF}/R$, or $F_{LO} = N(F_{REF})/R$. If $F_{LO}$ 34 deviates from the desired frequency (due to temperature effects, part to part differences, power supply variations, etc.), PLL 28 will inject current pulses into loop filter 30 to alter the control voltage to VCO 32 such that $F_{LO}$ 34 changes until the equation $F_{LO} = N(F_{REF})/R$ is satisfied. The values of N and R are typically digital patterns input into PLL 28, such that inputting a new set of digital patterns will change $F_{LO}$ 34. This change in $F_{LO}$ 34 is also referred to as a frequency hop. A digital circuit 42, for example a microprocessor or microcontroller, provides digital patterns to PLL 28 in order to initiate the above described frequency hop. N and R are integer values and VCXO 22 outputs a stable, fixed frequency. After PLL 28 is locked, $F_{LO}$ frequencies 34 will exist only in a limited number of discrete, evenly spaced steps, determined by the values of N and R, thereby placing a limit on the interference rejection provided by this circuit.

Figure 2:
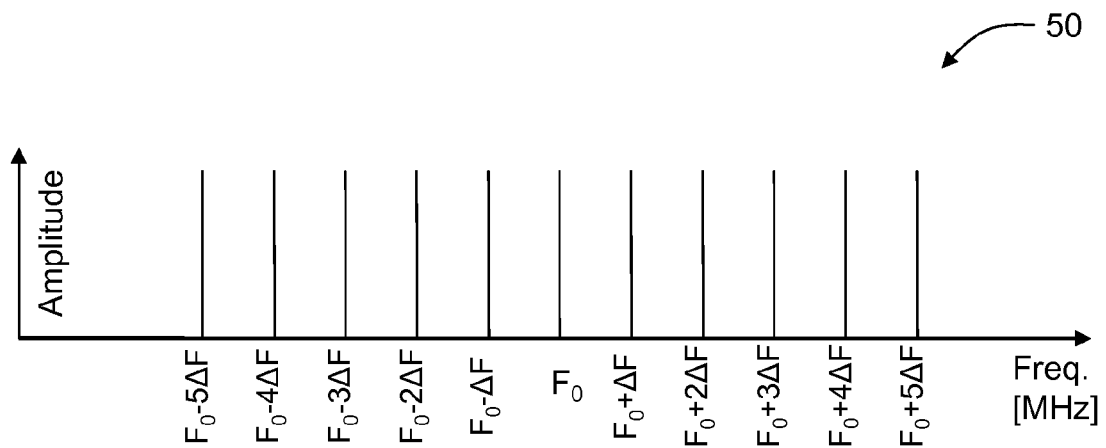
FIG. 2 is a diagram of the frequency spectrum of local oscillator output for the circuit of FIG. 1.

FIG. 2 is a sample frequency spectrum chart 50 of the output frequency of PLL circuit 20, shown in FIG. 1. The following example parameters are illustrative of one exemplary embodiment where: N=1000, 1001, 1002, ... 1010; R=20; and $F_{REF}$=40 MHz. The resulting values for $F_{LO}$ in MHz are then 2000, 2002, 2004 ... 2020 for a total of 11 frequency hops maximum in a given bandwidth, 2020−2000=20 MHz. A different set of R and N factors can be used to increase the number of frequency hops in a given bandwidth, but phase noise will degrade by 20 LOG(N). This means that doubling the N value will increase the phase noise by 6 dB. The methods and systems described below increase the number of frequency hops within a given bandwidth without an increase in phase noise.

Figure 3:
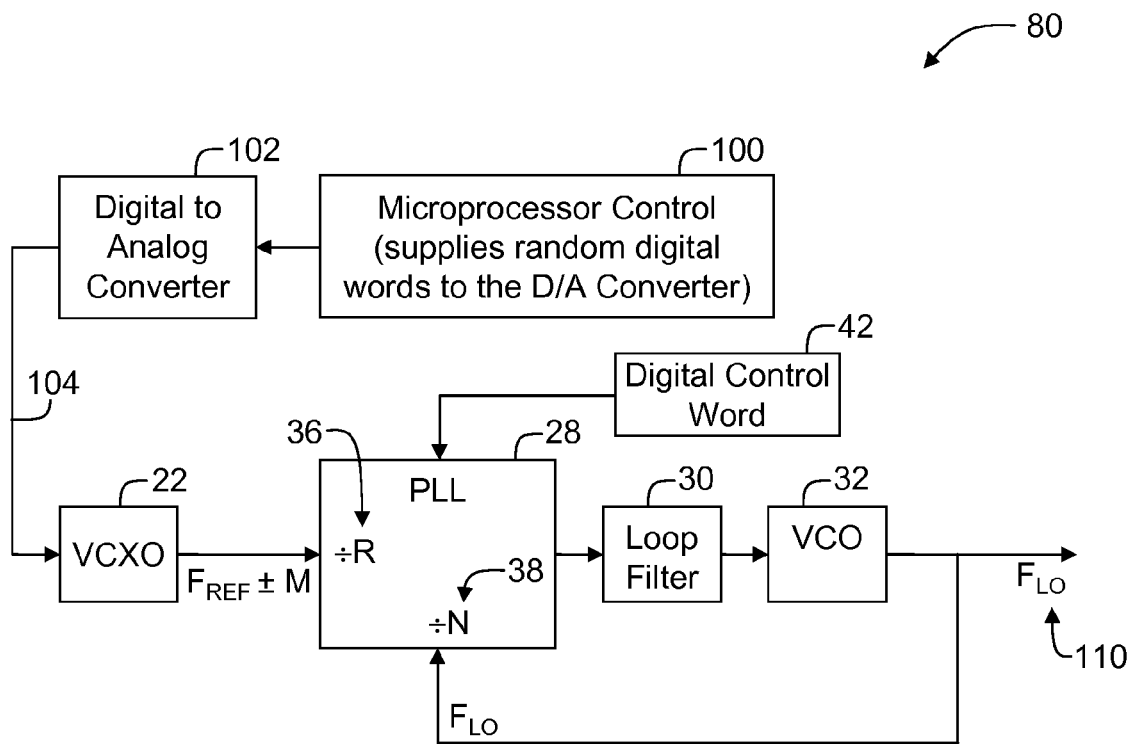
FIG. 3 is a block diagram of one embodiment of a PLL circuit that includes a voltage controlled crystal oscillator (VCXO) outputting a random frequency.

FIG. 3 shows a block diagram of one embodiment of a PLL circuit that includes a VCXO outputting a random frequency. More specifically, FIG. 3 is a block diagram of one embodiment of a PLL circuit 80 that includes VCXO 22 configured to receive discrete random DC control voltages. The circuit of FIG. 3 includes components that are common with the circuit of FIG. 1, and like components are labeled with like reference numerals. In the illustrated embodiment, a microprocessor 100 is programmed to supply random digital words to a digital to analog converter 102. Digital to analog converter 102 in turn supplies a random control voltage 104 to VCXO 22 based on the random digital words. In the embodiment, the control voltage 104 input to VCXO 22 is not held to any predetermined set level. Rather, the control voltage 104 is determined by the output of digital to analog converter 102 such that the control voltage 104 to VCXO 22 is discretely hopped in addition to discrete hops provided by the operation of PLL 28, as described above. A typical VCXO 22 has a frequency control range of ±200 parts per million (PPM) over the control voltage 104 range. Presenting a discrete random control voltage 104 to VCXO 22 via a circuit, such as microprocessor 100 in combination with digital to analog converter 102, provides a discrete random frequency deviation from the nominal $F_{REF}$. In the illustrated embodiment, the frequency output of VCXO 22 is $F_{REF}$±M, where M is a random integer from 0 to 200 PPM. The range of M corresponds to the typical VCXO 22 frequency control range.

A portion of $F_{LO}$ signal 110 is fed back to PLL 28 which frequency divides $F_{LO}$ 110 by factor N. The frequency output of VCXO 22, which in PLL circuit 80 of FIG. 3 is $F_{REF}$±M, is divided in PLL 28 by factor R. N and R are chosen such that $F_{LO}/N=(F_{REF}±M)/R$, or $F_{LO}=N(F_{REF}±M)/R$. Two transceivers in proximity that include the embodiment of FIG. 3 will exhibit an improved interference rejection ratio, since each transceiver will have greater random frequency agility.

Figure 4:
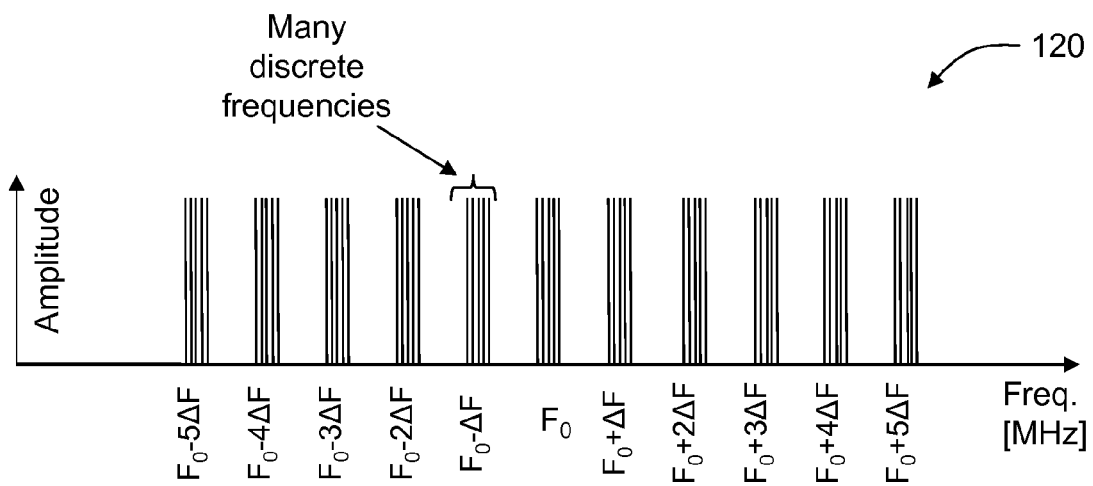
FIG. 4 is a diagram of the frequency spectrum of local oscillator output for the circuit of FIG. 3.

FIG. 4 shows a sample frequency spectrum chart 120 of the output frequency, $F_{LO}$ signal 110, of PLL circuit 80 shown in FIG. 3. The sample frequency spectrum shown in FIG. 4 is based on PLL circuit 80. The following example parameters are illustrative of one exemplary embodiment where: N=1000, 1001, 1002, ... 1010; R=20; $F_{REF}$=40 MHz; and M is a random integer from 0 to 200 PPM. The resulting values for $F_{LO}$ 110 in MHz still center around the same values as PLL circuit 20 of FIG. 1 (i.e., 2000, 2002, 2004, ... 2020) but include many discrete frequencies surrounding each of those values. Instead of 11 total discrete frequency hops, there are 4,411 total discrete frequency hops within the same 20 MHz bandwidth. This increase in total frequency hops improves the interference rejection ratio of two transceivers in proximity of one another.

Figure 5:
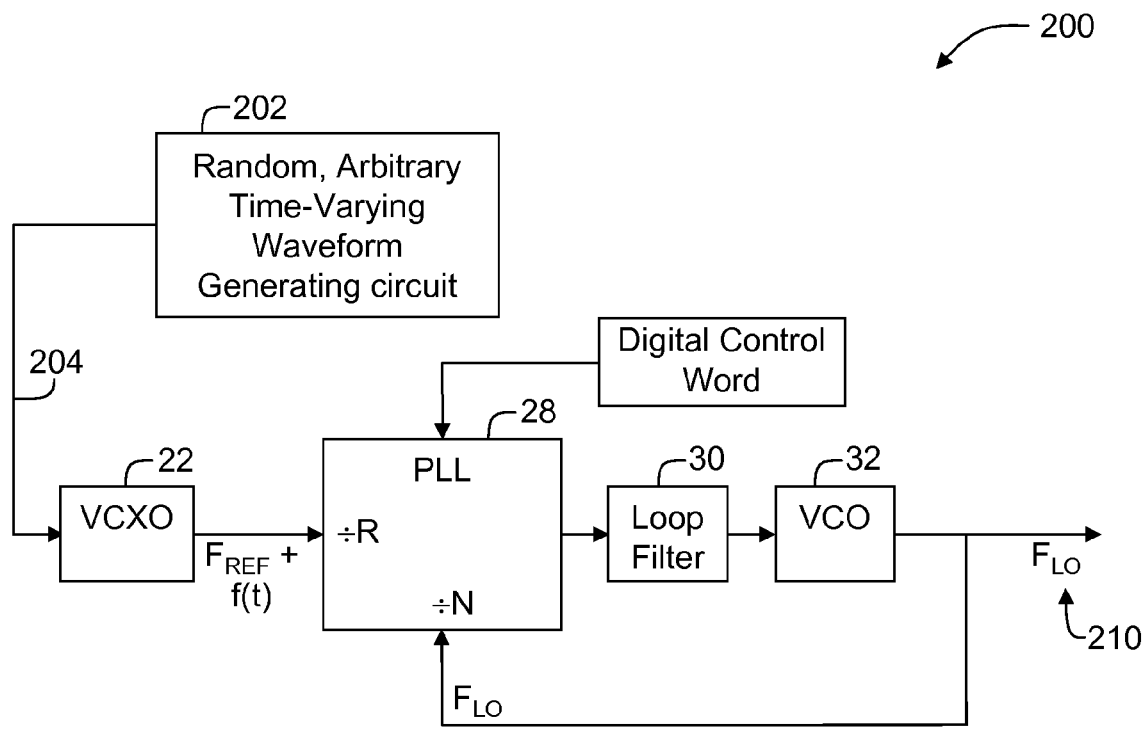
FIG. 5 is a block diagram an alternative embodiment of a PLL circuit that includes a VCXO outputting an arbitrary frequency.

FIG. 5 is a block diagram of an alternative embodiment of a PLL circuit that includes a VCXO outputting an arbitrary frequency. More specifically, FIG. 5 is a block diagram of an alternative embodiment of a PLL circuit 200 that includes VCXO 22 configured to receive a continuously time-varying analog control voltage. The circuit of FIG. 5 includes components that are common with the circuit of FIG. 3, and like components are labeled with like reference numerals. PLL circuit 200 operates in a similar manner to PLL circuit 80. In contrast to the combination of microprocessor 100 and digital to analog converter 102 of PLL circuit 80 that provides a discrete random control voltage 104 to VCXO 22, in PLL circuit 200, a waveform generator 202 is configured to output a continuously and slowly time-varying analog control voltage 204 to VCXO 22. The continuously and slowly time-varying analog control voltage 204 may, for example, be a sine wave with random amplitude and/or random frequency, or a random time-varying voltage dither. PLL 28 of PLL circuit 200 is also randomly hopped, as described above, due to changed values of factors N and/or R.

In the illustrated embodiment, VCXO 22 provides a continuously variable reference frequency to PLL 28. The frequency output of VCXO 22 can be described as the reference frequency output by VCXO 22 when a constant voltage is applied to it ($F_{REF}$), plus-or-minus the change in frequency, f(t), caused by the application of time-varying control voltage 204. In other words, the frequency output of VCXO 22 can be described as $F_{REF}±f(t)$. The two divide by factors, N and R of PLL 28, are chosen such that $F_{LO}/N=(F_{REF}±f(t))/R$, or $F_{LO}=N(F_{REF}±f(t))/R$. Two transceivers in proximity to one another utilizing the above described control method for the output of VCXO 22 have improved interference rejection, since each transceiver will have greater random frequency agility.

Figure 6:
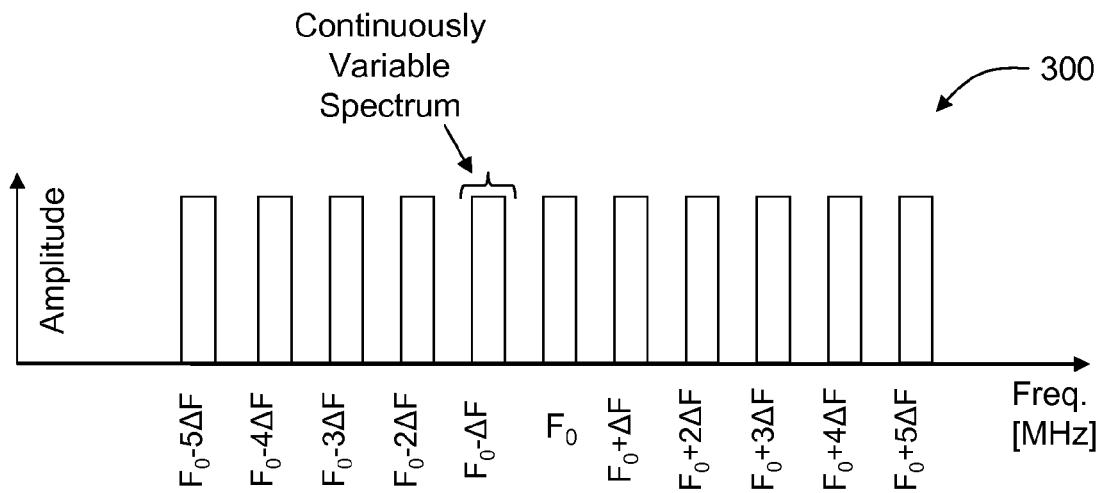
FIG. 6 is a diagram of the frequency spectrum of local oscillator output for the circuit of FIG. 5.

FIG. 6 shows a sample frequency spectrum chart 300 of the output frequency, $F_{LO}$ signal 210, of PLL circuit 200 shown in FIG. 5. The sample frequency spectrum shown in FIG. 6 is based on PLL circuit 200. The following example parameters are illustrative of one exemplary embodiment where: N=1000, 1001, 1002, ... 1010; R=20; $F_{REF}$=40 MHz; and f(t) is a continuously and slowly time-varying frequency of random amplitude and/or random frequency. The resulting values for $F_{LO}$ 210 in MHz once again center around the same values as PLL circuit 20 of FIG. 1 (i.e., 2000, 2002, 2004, ... 2020) but include a continuously variable spectrum of frequencies surrounding each of those values. Instead of 11 total discrete frequency hops, there is a continuous change in frequency around those 11 discrete frequency hops, all within the same 20 MHz bandwidth. This increase in frequency agility improves the interference rejection ration of two transceivers in proximity of one another.

Interference rejection between two or more transceivers can be improved if the output frequency, often created by an oscillator in a phase locked loop, associated with each transceiver randomly changes within a bandwidth. Using current methods, increasing the number of frequency changes degrades the phase noise of the oscillator such that an upper limit of frequency bins cannot be exceeded, and therefore limits the interference rejection. By further increasing the frequency agility of a phase locked loop oscillator within a bandwidth, the embodiments described herein provide greater interference rejection.

While the invention has been described in terms of various specific embodiments, those skilled in the art will recognize that the invention can be practiced with modification within the spirit and scope of the claims.

What is claimed is:

1. A method for controlling a frequency output of a phase locked loop (PLL), said method comprising:
   providing digital control words to the PLL to discretely change at least one dividing factor within the PLL;
   applying a time-varying control voltage directly to a voltage controlled oscillator with a method comprising:
      applying random digital data to a digital to analog converter directly from a signal generator; and
      using an output of the digital to analog converter as the control voltage for the voltage controlled oscillator;
   applying an output of the voltage controlled oscillator to the PLL as a reference frequency; and
   outputting a signal from the PLL, the signal varied in frequency based on one or more of the time-varying control voltage and the at least one dividing factor, wherein the PLL comprises:
      a first divider configured to divide the reference frequency by a first factor; and
      a second divider configured to divide at least a portion of the outputted signal fed back to the PLL by a second factor.

2. A method according to claim 1 wherein applying random digital data comprises programming a processing device to output the random digital data.

3. A method according to claim 1 wherein providing digital control words to the PLL to discretely change at least one dividing factor within the PLL comprises utilizing the digital control words to cause the PLL to divide at least one of the reference frequency input into the PLL, and a frequency based on the outputted signal fed back to the PLL.

4. A method for controlling a frequency output of a phase locked loop (PLL), said method comprising:
   providing digital control words to the PLL to discretely change at least one dividing factor within the PLL;
   applying a randomly varying control voltage directly to a voltage controlled oscillator by applying a varying analog control voltage as the control voltage for the voltage controlled oscillator, wherein applying the varying analog control voltage comprises:
      applying a sine wave with at least one of a random amplitude and a random frequency;
   applying an output of the voltage controlled oscillator to the PLL as a reference frequency; and
   outputting a signal from the PLL, the signal varied in frequency based on one or more of the randomly varying control voltage and the at least one dividing factor.

5. A method according to claim 4 wherein applying a varying analog control voltage as the control voltage for the voltage controlled oscillator comprises randomly varying the control voltage in one or more of amplitude and frequency.

6. A frequency hopping oscillator unit comprising:
   a voltage controlled oscillator;
   a phase locked loop (PLL) operatively coupled to the voltage controlled oscillator, the PLL comprising:
      a first divider configured to divide a varying reference frequency by a first factor; and
      a second divider configured to divide at least a portion of an output frequency fed back to the PLL by a second factor; and
   a signal generator configured to output a randomly varying control voltage directly to said voltage controlled oscillator, said voltage controlled oscillator configured to output the varying reference frequency to said PLL based on the randomly varying control voltage;
   wherein said signal generator is configured to output a sine wave with at least one of a random amplitude and a random frequency.

7. A unit according to claim 6 wherein said signal generator comprises a digital to analog converter, an output of said digital to analog converter coupled to said voltage controlled oscillator, said digital to analog converter configured to receive random digital data.

8. A unit according to claim 7 wherein said signal generator further comprises a processing device configured to provide the random digital data to said digital to analog converter.

9. A unit according to claim 6 wherein said signal generator is configured to output a varying analog control voltage.

10. A unit according to claim 6 wherein the voltage controlled oscillator comprises a voltage controlled crystal oscillator.

11. A system according to claim 6 wherein said signal generator comprises an arbitrary waveform generating circuit.

12. A system for providing local oscillator frequencies for at least one of a transmitter, receiver, and transceiver, said system comprising:
   a first voltage controlled oscillator;
   a phase locked loop (PLL) operatively coupled to the first voltage controlled oscillator, the PLL comprising:
      a first divider configured to divide a varying reference frequency by a first factor; and
      a second divider configured to divide at least a portion of an output frequency fed back to the PLL by a second factor;
   a second voltage controlled oscillator configured to receive an output signal from the PLL; and
   a signal generator comprising a digital to analog converter, an output of said digital to analog converter coupled to said first voltage controlled oscillator, said digital to analog converter configured to receive random digital data, said signal generator configured to supply a randomly varying control voltage directly to said first voltage controlled oscillator, said first voltage controlled oscillator configured to provide the varying reference frequency to said PLL based on the randomly varying control voltage, wherein local oscillator frequencies are based on the output signal of said PLL.

13. A system according to claim 12 wherein said signal generator further comprises a processing device configured to provide the random digital data to said digital to analog converter.

14. A system according to claim 12 wherein said signal generator is configured to output at least one of a varying analog control voltage, a sine wave with at least one of a random amplitude and a random frequency, and a randomly dithering voltage.

15. A system according to claim 12 wherein said second voltage controlled oscillator is configured to output the local oscillator frequencies.

* * * * *